United States Patent
Horita et al.

(10) Patent No.: US 6,323,102 B1
(45) Date of Patent: *Nov. 27, 2001

(54) METHOD OF MANUFACTURING A SEMICONDUCTOR DEVICE

(75) Inventors: Katsuyuki Horita; Takashi Kuroi; Maiko Sakai, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/090,422

(22) Filed: Jun. 4, 1998

(30) Foreign Application Priority Data

Jan. 27, 1998  (JP) .................................. 10-014119

(51) Int. Cl.⁷ ..................................................... H01L 21/76
(52) U.S. Cl. ........................... 438/424; 438/435; 438/437; 438/692; 438/427
(58) Field of Search ..................................... 438/425, 426, 438/427, 435, 437, 424, 692

(56) References Cited

U.S. PATENT DOCUMENTS 5,851,899 * 12/1998 Weigand ............................... 438/427
5,911,110 * 6/1999 Yu ........................................ 438/424
5,923,993 * 7/1999 Sahota .................................. 438/427
5,943,590 * 8/1999 Wang et al. .......................... 438/427

FOREIGN PATENT DOCUMENTS

| 0 825 645 A1 | 2/1998 | (EP) . |
| 2 306 050 | 4/1997 | (GB) . |
| 3-30300 | 4/1991 | (JP) . |

* cited by examiner

Primary Examiner—Trung Dang
(74) Attorney, Agent, or Firm—McDermott, Will & Emery

(57) ABSTRACT

A method of manufacturing a semiconductor device having a microminiture trench isolation in which an insulating film is embedded by an HDP-CVD method comprising: a step of pre-planarization by conducting a dry etching selectively with respect to the insulating film laminated excessively on the surface of substrate, which is to be an active region, and a step of polishing by a CMP method in order to improve a surface planarity of the insulating film, wherein an etching mask used at the time of opening a trench opening portion has a multi-layer structure including a silicon nitride film and a polycrystal silicon film; the polycrystal silicon film is used as an etching stopper at the time of pre-planarization; and the silicon nitride film is used as an etching stopper at the time of polishing by a CMP method in order to remove simultaneously the excessive insulating film and the polycrystal silicon film to expose and a surface of the substrate, which is the active region, whereby the trench isolation having a satisfactory shape is obtainable.

2 Claims, 11 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device, in particular formation of a trench isolation.

2. Discussion of Background

FIGS. 17a through 17c show a method of forming a trench isolation disclosed in Japanese Unexamined Patent Publication No. Hei 3-30300 (JP-A-3-30300) as a conventional technique, wherein an etching mask having a structure of laminating a polycrystalline silicon film and a silicon nitride film is used at the time of forming an opening portion of trench; a sputter etching is conducted using the polycrystalline silicon film as an etching stopper after the trench isolation is formed by embedding an insulating film in the trench opening portion; and the etching mask is removed by a wet etching or a dry etching in order to expose a surface of semiconductor substrate and leave the trench isolation.

As shown in FIG. 17a, after a silicon oxide film 102 is formed on a surface of semiconductor substrate 101 by a thermal oxidation method, a silicon nitride film 103 and a polycrystalline silicon film 104 are successively laminated by a chemical vapor deposition (CVD) method. The silicon nitride film 103 and the polycrystalline silicon film 104 are used as a mask for opening trench, and the silicon nitride film 103 serves as a protection film in the later step of heat treatment process. After a mask pattern having a cripping pattern corresponding to the trench isolation by patterning the polycrystalline silicon film 104 and the silicon nitride film 103, a trench opening portion 105 having a width of 1 μm is opened in the semiconductor substrate 101 using this mask pattern.

Thereafter, as shown in FIG. 17b, a silicon oxide film 106 is formed in an inner wall and a bottom surface of the trench opening portion 105 by a heat treatment, a silicon oxide film 107 is formed by a CVD method or a thermal oxidation method to embed in the trench opening portion 105. Further, a photoresist 108 is laminated on a surface of silicon oxide film 107.

In the next, as shown in FIG. 17c, the photoresist 108 and the silicon oxide film 107 both positioned over the surface of polycrystalline silicon film 104 are removed by a sputter etching. Thereafter, as shown in FIG. 17b, the polycrystalline silicon film 104 is removed by a wet etching or a dry etching, and simultaneously a part of the silicon oxide film 107 exists within the same thickness as that of the polycrystalline silicon film 104 is removed. In this, the property of the silicon oxide film 107 is made dense by a heat treatment.

In the next, as shown in FIG. 17e, the silicon oxide film 103 is removed by a wet etching or a dry etching; the silicon oxide film 102 is removed; and simultaneously a part of the silicon oxide film 107 existing above the surface of semiconductor substrate 101 is selectively removed, whereby the trench isolation made of the silicon oxide films 106 and 107 is obtainable in the trench opening portion 105.

In this, the polycrystalline silicon film 104 is used as a stopper film for etching back the silicon oxide film 107 which is an insulating film for embedding. In addition, the silicon nitride film 103 is used as a mask at the time of heat treatment for making the property of silicon oxide film 107 dense, which serves as an oxide film of the trench isolation.

Accordingly, the semiconductor substrate 101 which becomes an active region is not damaged nor contaminated.

However, when the size of trench isolation becomes small by microminiaturization of elements of the semiconductor device, the following problems occur.

FIG. 18 is a cross-sectional view in a case that a trench opening portion 105a having an opening width s as the minimum feature size and a trench opening portion 105b having a larger opening width than the minimum feature size were opened using a mask pattern 109 as an etching mask.

In this case, when a silicon oxide film 108a is formed by a low pressure CVD method, the trench opening portions 105a having the opening widths of the minimum feature size could not be embedded by an insulating film, whereby a seam (space) 110 appears. As a result, such a seam was left as a recessed portion in a stage of obtaining a trench isolation, and a conductive material was left by, for example, being embedded in the recessed portion in a later step of forming an active element, thereby to possibly cause a short, where the trench isolation obtainable by embedding the insulating film in the trench opening portion 105b is designated by numeral 107b.

An example of embedding a trench having microminiture size by a high density plasma-chemical vapor deposition (HDP-CVD) method is described in the following, instead of the embedding by a low pressure CVD method. FIG. 19 is a cross-sectional view of a case that the silicon oxide film 108b formed by an HDP-CVD method is used to embed the inside of trench opening portion 105a having a minimum feature size. In FIG. 19, numerals 109a, 109b and 109c designate mask patterns having dimensions in the horizontal direction in this cross-sectional view are respectively Xa, Xb and Xc, where Xa<Xb<Xc. Xa is a size corresponding to the minimum feature size. The numerals already used in the above description designate the same or the similar portions.

When the film is formed by the HDP-CVD method, it is possible to embed satisfactorily without causing a seam even for a microminiature opening dimension because the silicon oxide film 108b used for embedding the trench opening portion 105a is laminated and simultaneously corner portions of the laminated film are etched intensively.

When the silicon oxide film 108b laminated by the HDP-CVD method is formed with an angle of 45° in the mask patterns 109a, 109b and 109c, it becomes a film having shapes of isosceles triangle in its section, of which heights are ha and hb corresponding halves of Xa and Xb respectively, on the mask patterns 109a and 109b. In a large mask such as the mask patterns 109c, the silicon oxide film 108b having a thickness of hc which corresponds to a film thickness of laminated film for embedding in the trench opening portion 105a at most.

As a method of removing an excessive part of the silicon oxide film 108b laminated on the mask patterns 109a, 109b and 109c, abrasion by a chemical mechanical polishing (CMP) method or a dry etching, conducted selectively using an etching mask, can be considered.

However, the abrasion by CMP method was not suitable for treatment of an area where many silicon oxide films 108b as thick as that laminated on the mask pattern 109c. This was because of a matter of planarity in a surface to be processed which was obtainable after the treatment. Because, in the mask pattern 109a, a surface having an even height was not obtainable between in a region formed with many silicon oxide films 108b having a small film thickness and in a region formed with many silicon oxide films 108b having a large film thickness after planarizing by the CMP method, this affection was left in the region having the silicon oxide films 108b having a large film thickness after the planarization, whereby the surface was formed in a higher position than that in the other region.

Further, because the abrasion by the CMP method required a high cost, it was not suitable for the etching with respect to a thick film.

In FIGS. 20a and 20b, a case that the silicon oxide film 108b on the mask patterns 109a, 109b and 109c are removed by a selective dry etching. At first, as shown in FIG. 20a, resist patterns 111 are formed on regions which will be trench isolation 107a, namely, trench opening portions 105a. However, deviations x in alignment occur when the resist patterns 111 are not formed completely in conformity with the upsides of trench opening portions 105a.

Thereafter, as shown in FIG. 20b, an excessive silicon oxide film 108b is removed by a dry etching using the resist patterns 111 as an etching mask. However, when the mask patterns 109a, 109b and 109c are made of a silicon nitride film, the etching is overly conducted in a region where the film thickness of silicon oxide film 108b positioned on the mask patterns 109a, 109b and 109c is small to thereby cause scrapes A, B and C because a selective ratio between the silicon oxide film 108b and the silicon nitride film 109c is not sufficiently assured. Thus, there was a problem that a part of the trench isolation 107a is scraped because of the deviation x in alignment; and parts of the mask patterns 109a, 109b and 109c positioned in the active region and a part of the active region are scraped because the mask patterns 109a, 109b and 109c do not have a stopper in their upper-most layers.

SUMMARY OF THE INVENTION

It is an object of the present invention to solve the above-mentioned problems inherent in the prior art and to provide a method of manufacturing a semiconductor device having a trench isolation applicable to a large-sized integration of elements, wherein an insulating film can be embedded in a microminiture trench opening portion; a semiconductor substrate which will be an active region is not damaged in the following steps of producing the same; and the trench isolation having a satisfactory shape can be provided.

According to a first aspect of the present invention, there is provided a method of manufacturing a semiconductor device comprising: a step of forming a first mask pattern having a clipping pattern corresponding to a region of trench isolation on a semiconductor substrate, a step of forming a trench opening portion by etching the region of trench isolation on the semiconductor substrate, a step of laminating an insulating film on the semiconductor substrate and embedding the insulating film in the trench opening portion, a step of forming a second mask pattern in a region corresponding to the region of trench isolation, a step of pre-planarizing in advance by conducting a dry etching with respect to the insulating film using the second mask pattern as an etching mask, a step of removing the second mask pattern and polishing the insulating film by a CMP method using the first mask pattern as a stopper, and a step of obtaining the trench isolation in the region of trench isolation by removing the first mask pattern and exposing a surface of the semiconductor substrate.

According to a second aspect of the present invention, there is provided a method of manufacturing a semiconductor device according to the first aspect of the invention, wherein the first mask pattern has a multi-layer structure in which the first mask layer and the second mask layer are sequentially laminated; the second mask layer serves as the etching stopper in a dry etching at the time of pre-planarization; and the second mask layer is polished at the same polishing rate as that of the insulating film at the time of planarizing by the CMP method using the first mask layer as a stopper.

According to a third aspect of the present invention, there is provided a method of manufacturing a semiconductor device according to the second aspect of the invention, wherein the first mask layer is a silicon nitride film; and the second mask layer is made of a non-single crystal silicon film.

According to a fourth aspect of the present invention, there is provided a method of manufacturing a semiconductor device according to the first aspect of the invention, wherein the end surface of second mask pattern used for processing the pre-planarization with respect to the insulating film is disposed on an end portion of the first region corresponding to the region of trench isolation or the second region surrounding the first region; and a distance from the end portion of the first region to the outer periphery of second region corresponds to an alignment margin requisite at the time of forming the second mask pattern.

According to a fifth aspect of the present invention, there is provided a method of manufacturing a semiconductor device according to the fourth aspect of the invention, wherein a distance from the end portion of first region to the outer periphery of second region corresponds to a half of minimum feature size when the insulating film is laminated by an HDP-CVD method.

According to a sixth aspect of the present invention, wherein there is provided a method of manufacturing a semiconductor device according to the first aspect of the invention, when the insulating film is formed by a low-pressure CVD method, the end surface of second mask pattern used for processing the pre-planarization with respect to the insulating film is disposed on a region in which the film thickness of the insulating film laminated on the trench isolation region in the vertical direction is the sum of a height from the bottom surface of trench opening portion to the bottom surface of first mask pattern and a film thickness of the insulating film laminated on the first mask pattern or more.

According to a seventh aspect of the present invention, there is provided a method of manufacturing a semiconductor device according to any one of the first, fourth, fifth and sixth aspects of the invention, wherein the second mask pattern is pattered to have a size of minimum feature size or more.

BRIEF DESCRIPTION OF THE DRAWINGS

A more complete application of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

A detailed explanation will be given of preferred embodiments of the present invention in reference to FIGS. 1 through 16c as follows, wherein the same numeral references are used for the same or the similar portions and description of these portions is omitted.

EXAMPLE 1

Figure 1:
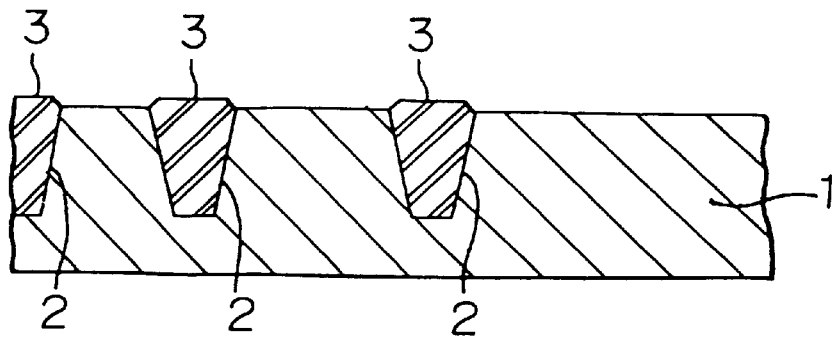
FIG. 1 is a cross-sectional view for showing a part of semiconductor device according to Example 1 of the present invention.

FIG. 1 is a cross-sectional view for showing trench isolation 3 formed in a semiconductor substrate, wherein the trench isolation 3 is made of an insulating material embedded in trench opening portions 2 having a narrow opening width. The opening width of trench opening portions 2 is for example 200 nm.

A method of forming the trench isolation 3 shown in FIG. 1 is described in the following.

Figure 2:
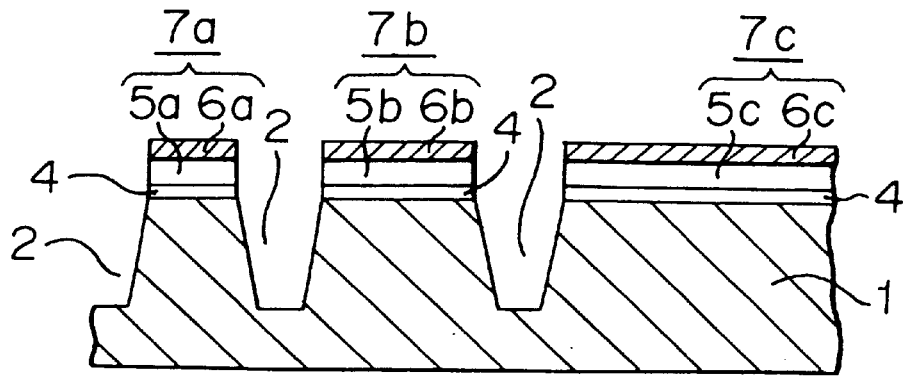
FIG. 2 is a cross-sectional view of a part of the semiconductor device according to Example 1 for explaining the process flow thereof.

At first, as shown in FIG. 2, an underlying oxide film 4 having a film thickness of about 5 through 30 nm is formed by oxidizing a surface of semiconductor substrate 1, and a silicon nitride film and a polycrystal silicon film are successively laminated so that they have a film thickness of about 100 through 300 nm and the film thickness of about 50 through 300 nm respectively. Further, after a resist pattern having a clipping pattern corresponding to a region of forming the trench isolation 3 is formed, the polycrystal silicon film and the silicon nitride film are subjected to a selective etching using the resist pattern as an etching mask to obtain mask patterns 7a, 7b and 7c which are formed by laminated by the silicon nitride films 5a, 5b and 5c and the polycrystal silicon films 6a, 6b and 6c respectively. Further, the semiconductor substrate 1 is subjected to an anisotropic etching in order to form the trench opening portions 2 having an opening width of 200 nm and a depth of about 100 through 500 nm, for example 300 nm. Then, the resist pattern is removed.

Also, it is possible to form the trench opening portions 2 by other methods

Figure 3:
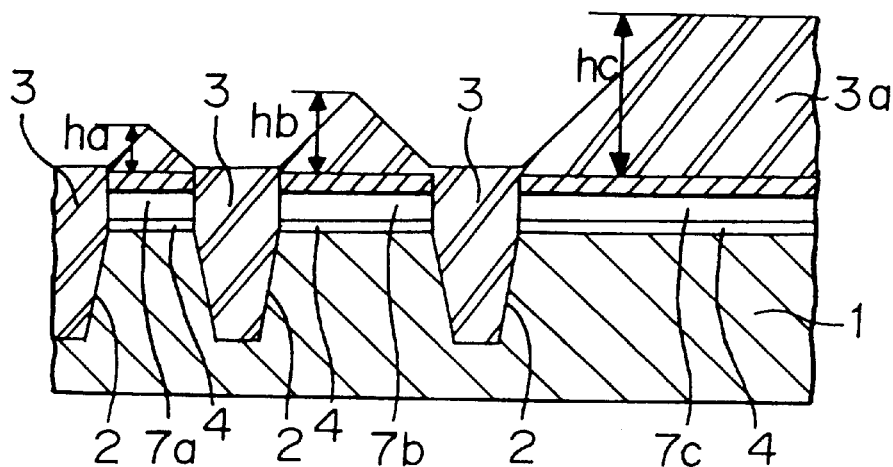
FIG. 3 is a cross-sectional view of a part of the semiconductor device according to Example 1 for explaining the process flow thereof.

In the next, as shown in FIG. 3, an HDP-CVD oxide film 3a is laminated to have a film thickness of about 355 through 1130 nm by an HDP-CVD method in order to embed the trench opening portions 2 completely. Since the HDP-CVD method is adopted to form the film, it is possible to embed completely the insides of trench opening portions 2 and a defect such as a seam does not occur. For example, in a case that, the HDP-CVD oxide film 3a is laminated with an angle of 45° from an end of the mask pattern 7a and a size of the mask pattern a in a horizontal section is a minimum feature size, a height ha of the HDP-CVD oxide film 3a in the mask pattern 7a becomes a half of the minimum feature size.

When the dimension in the horizontal direction of the mask pattern 7b in section is two times of the minimum feature size, the height hb of the HDP-CVD oxide film 3a is as much as the minimum feature size. On the mask pattern 7c having a larger size than that of the mask pattern 7b, the HDP-CVD oxide film of a height of hc corresponding to a film thickness laminated by the HDP-CVD method is laminated.

Further, by adjusting an upper surface of the HDP-CVD oxide film 3a positioned above the trench opening portion 2 to be an equal height to the upper surfaces of the polycrystal silicon films 6a, 6b and 6c, it is possible to minimize a time of polishing by a CMP method in a later step.

Figure 4:
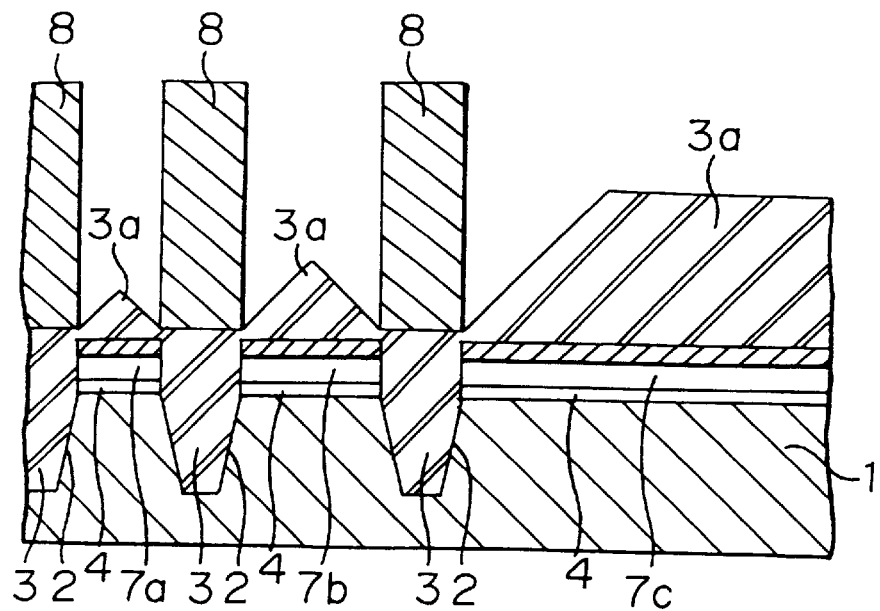
FIG. 4 is a cross-sectional view of a part of the semiconductor device according to Example 1 for explaining the process flow thereof.
Figure 5:
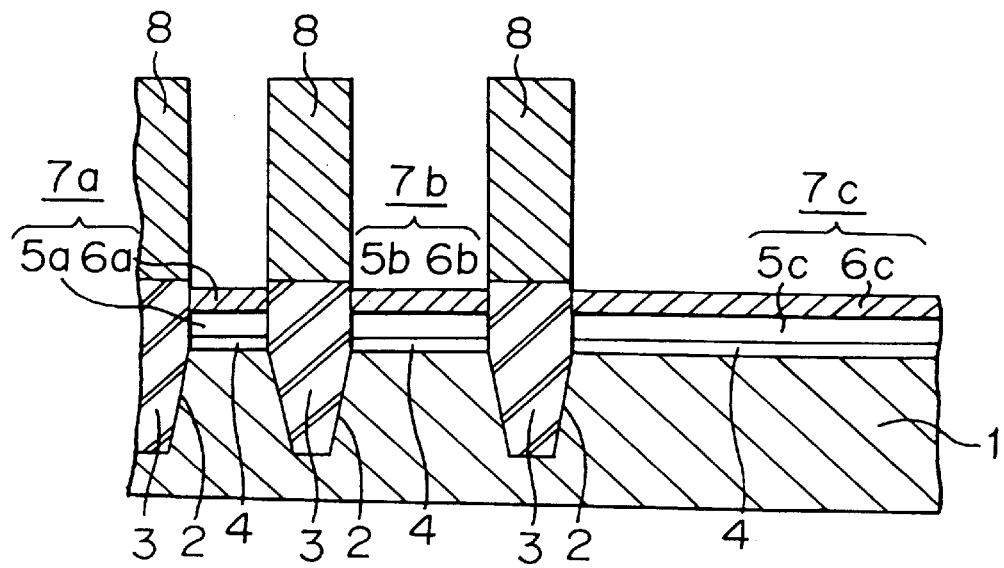
FIG. 5 is a cross-sectional view of a part of the semiconductor device according to Example 1 for explaining the process flow thereof.

In the next, as shown in FIG. 4, resist patterns 8 are formed on the trench isolation 3.

Thereafter, the HDP-CVD oxide films 3a are subjected to a dry etching using the resist pattern 8 as an etching mask, whereby an excessively laminated HDP-CVD oxide films 3a are removed and portions necessary for forming the trench isolation 3 are left.

At this time, although a part or the whole of the surfaces of the polycrystal silicon films 6a, 6b and 6c in a flat shape are exposed in the region subjected to the dry etching because the polycrystal silicon film has an sufficiently large etching selectivity in comparison with the silicon oxide film, the silicon nitride films 5a, 5b and 5c positioned in a lower layer thereof is not exposed and a part of the silicon nitride films are not removed by the etching.

Figure 6:
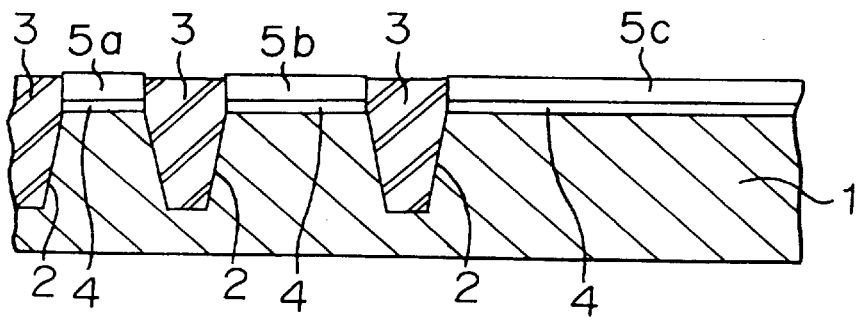
FIG. 6 is a cross-sectional view of a part of the semiconductor device according to Example 1 for explaining the process flow thereof.

In the next, as shown in FIG. 6, the resist patterns 8 are removed; an abrasion is conducted by a CMP method using the silicon nitride films 5a, 5b and 5c as an stopper thereby to remove the polycrystal silicon films 6a, 6b and 6c composing the mask patterns 7a, 7b and 7c ; and the abrasion is conducted simultaneously with respect to the HDP-CVD oxide films 3a to thereby planarize a surface to be treated. At this time, because the polycrystal silicon films and the silicon oxide films have an equal rate of polishing, the planarization of the surface to be treated becomes satisfactory.

Thereafter, the silicon nitride films 5a, 5b and 5c are removed by a wet etching using hot phosphoric acid under an etching condition, for example in which the selectivity of silicon oxide film can sufficiently be maintained in comparison with the silicon nitride film and the underlining oxide film 4 made of the silicon oxide film is subjected to an etch back until a surface of the semiconductor substrate 1 is exposed, whereby the trench isolation 3 as shown in FIG. 1 are obtainable.

Thus formed trench isolation 3 have a satisfactory shape with excellent planarity without recessed portions caused by a seam or the like on their surfaces. Further, after the trench opening portions 2 are embedded by the HDP-CVD method, the pre-planarization of removing the excessive insulating films on the mask patterns 7a, 7b and 7c. Therefore it is possible to make the surface to be treated as flat as possible by the time of polishing by the CMP method in a later step; the planarity of the surface to be treated to be obtained by the abrasion using the CMP method can be improved; and the surface planarity of the trench isolation 3 to be obtained consequently can be improved.

Further, a time of processing by the CMP which requires a high cost can be reduced because the absolute value of oxide film which should be polished by the CMP method is reduced by conducting the pre-planarization.

Further, it is possible to form the polycrystal silicon films 6a, 6b and 6c composing the mask patterns 7a, 7b and 7c by an amorphous silicon, whereby effects similar to those described in the above is obtainable.

EXAMPLE 2

In Example 1 , the case that the resist patterns 8 used as an etching mask at the time of pre-planarization are formed on the trench isolation 3 without deviation in overlaying is exemplified. A characteristic of this Example 2 is that a resist pattern used as an etching mask at the time of pre-planarization is formed so as to protrude outwardly by an alignment margin x1, for example 50 nm, from a region of forming a trench isolation 3.

Figure 7:
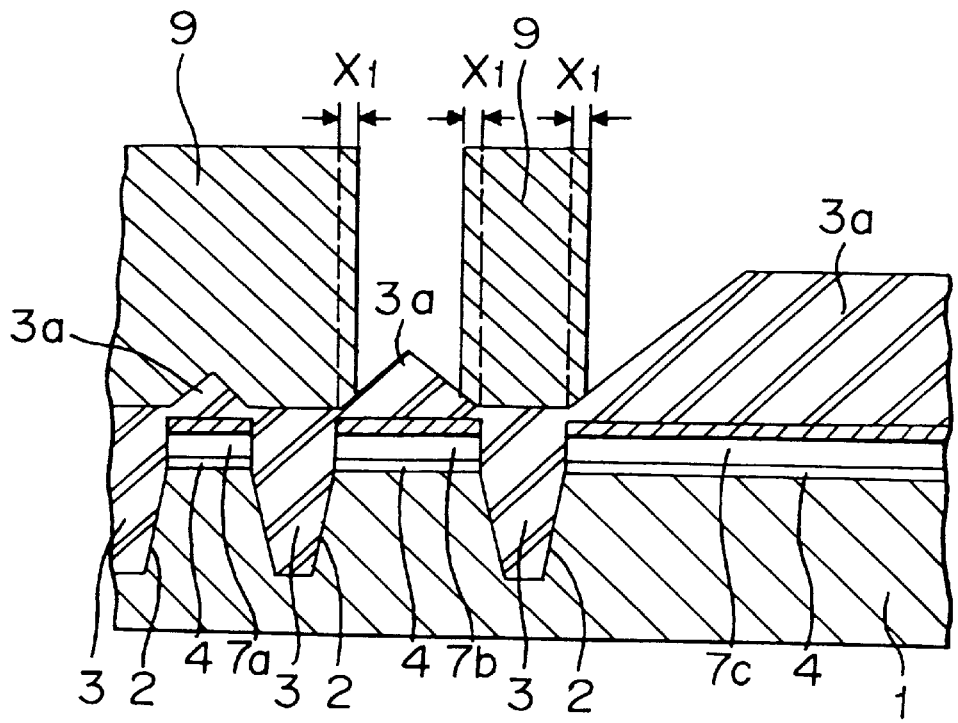
FIG. 7 is a cross-sectional view of a part of the semiconductor device according to Example 2 of the present invention for explaining a process flow thereof.

FIG. 7 is a cross-sectional view at the time of forming resist patterns 9 which serve as an etching mask when the pre-planarization is conducted in Example 2 . Steps similar to those of Example 1 are conducted before the resist patterns 9 are formed.

As shown in FIG. 7, since end surfaces of resist patterns 9 are formed so as to protrude by a size x1, which size corresponds to an alignment margin, outwardly from end surfaces of the trench isolation 3, the end surfaces of resist patterns 9 are not disposed on the trench isolation 3 even though the alignment is deviated under such a condition.

Figure 8:
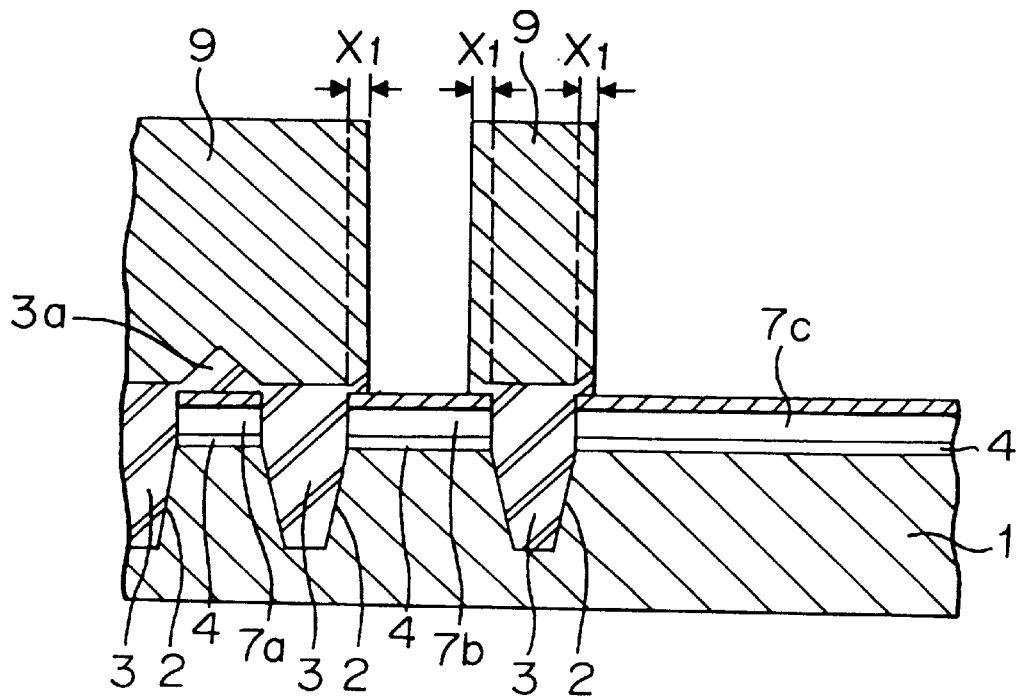
FIG. 8 is a cross-sectional view of a part of the semiconductor device according to Example 2 of the present invention for explaining the process flow thereof.

By conducting an anisotropic etching with respect to an HDP-CVD oxide film 3a using the resist patterns 9, the HDP-CVD oxide film 3a is removed in a region in which HDP-CVD oxide film 3a is thick as shown in FIG. 8.

Since the shape of resist patterns 9 is determined in consideration of the alignment margin x1, an insulating film necessary for constituting the trench isolation 3 at the time of pre-planarization is not removed and it is possible to leave the insulating film constituting the trench isolation 3 without fault.

In this, the resist patterns 9 used as an etching mask at the time of pre-planarization is not opened above a mask pattern 7a patterned so as to have a size corresponding to a minimum feature size and selectively opened above a mask pattern having a size or more in its horizontal direction, which size obtained by adding the minimum feature size and two times of the size of alignment margin x1. By determining the opening portion as such, the pattern having the minimum feature size or less is not produced, whereby it is not necessary to contract a design rule.

As described in the above, the resist patterns 9 are formed as an etching mask in consideration of the alignment margin to thereby conduct the pre-planarization, whereby it is possible to make the shape of the surface to be treated as flat as possible. Also, there is an effect that the planarity is improved after the CMP method is conducted because the sizes of protruded portions made of the HDP-CVD oxide film 3a, which should be polished by the CMP method, are substantially the same. Further, it is possible to reduce a time of processing by the CMP method, which is a costly treatment, by reducing the amount of abrasion using the CMP method, whereby the cost can also be reduced.

Incidentally, layers including the silicon nitride films 5a, 5b and 5c and lower parts than the silicon nitride films are not excessively etched because the uppermost layers of the mask patterns 7a, 7b and 7c are composed of the polycrystal silicon films 6a, 6b and 6c which work as an etching stopper at the time of pre-planarization, as in Example 1.

EXAMPLE 3

Figure 9:
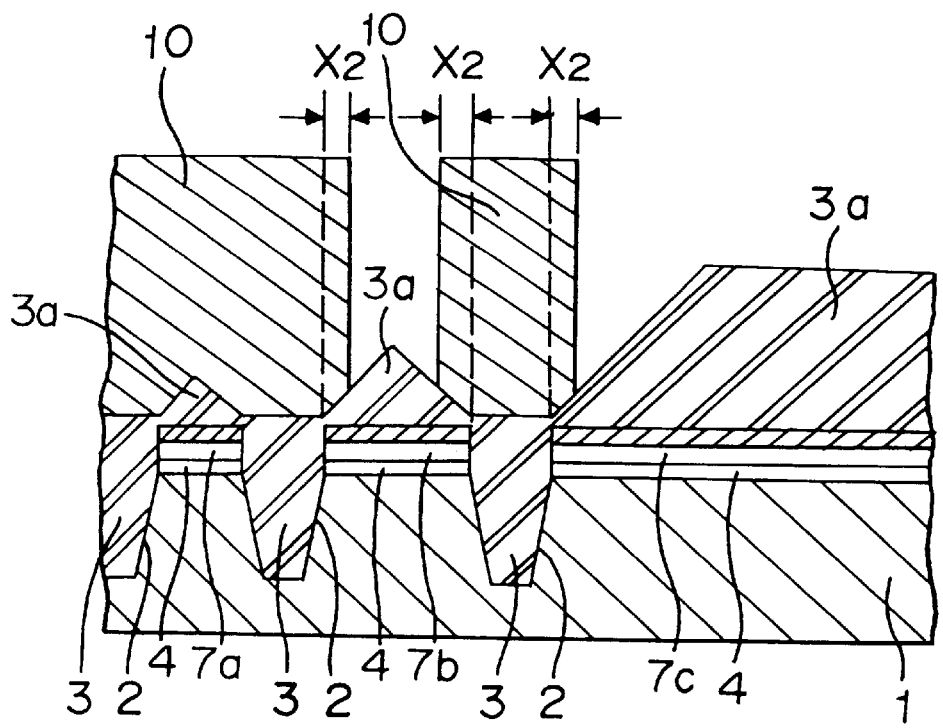
FIG. 9 is a cross-sectional view for showing a part of a semiconductor device according to Example 3 of the present invention for explaining a process flow thereof.

In Example 2 , the case that the resist pattern 9 used as an etching mask at the time of pre-planarization has a shape of protruding outwardly from the region of forming the trench isolation 3 by the deviation x1 of overlap is exemplified. In Example 3 , a case that shapes of resist patterns 10 used as an etching mask at a time of pre-planarization protrudes from end surfaces of trench isolation by a size of x2, which is a half of a minimum feature size, is described. When the minimum feature size is 200 nm, the size x2 is 100 nm Concerning steps before a step of forming an HDP-CVD oxide film 3a, the steps similar to those described in Example 1 are adopted. The resist patterns 10 used as an etching mask at the time of pre-planarization in a later process is formed in a region protruding from the trench isolation by a half of the minimum feature size on the HDP-CVD oxide film 3a laminated on the trench isolation 3 and mask patterns 7a, 7b and 7c as shown in FIG. 9.

Figure 10:
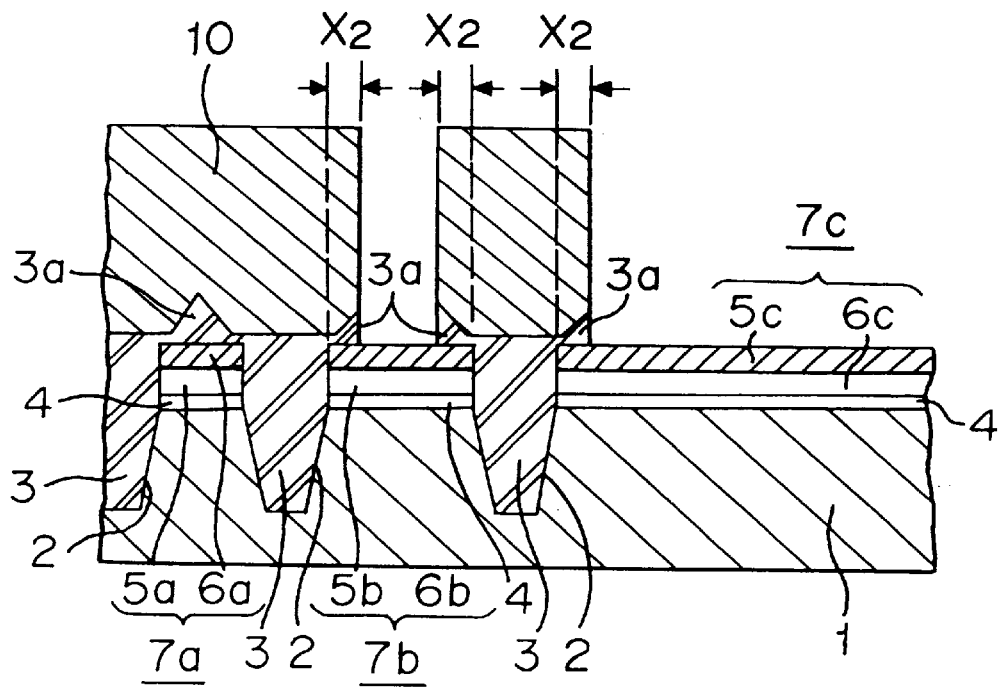
FIG. 10 is a cross-sectional view for showing a part of the semiconductor device according to Example 3 of the present invention for explaining the process flow thereof.

When a dry etching is conducted with respect to the HDP-CVD oxide film 3a using the above described resist patterns 10 as an etching mask, the dimensions of HDP-CVD oxide film 3a to be left on the mask patterns 7a, 7b and 7c in its height direction correspond to a half of the minimum feature size is 45° as shown in FIG. 10, provided that an angle of inclination of the HDP-CVD oxide film 3a laminated on the mask patterns from its end portion.

At this time, the shapes of HDP-CVD oxide films left on the mask patterns 7a, 7b and 7c are arranged to have the heights of a half of the minimum feature size.

Thereafter, the resist patterns 10 are removed; polycrystal silicon films 6a, 6b and 6c are polished by a CMP method using silicon nitride films 5a, 5b and 5c as a stopper; and simultaneously, parts of the HDP-CVD oxide films 3a positioned at and above a height corresponding to the height of polycrystal silicon films 6a, 6b and 6c on the trench isolation 3.

Since the height of HDP-CVD oxide film 3a left on the mask patterns 7a, 7b and 7c are arranged to be substantially a half of the minimum feature size at the stage of polishing by the CMP method, it is possible to further improve the planarity of surface to be treated after the abrasion by the CMP method.

Succeeding processes are conducted in a similar manner to those described in Example 1, wherein silicon nitride films 5a, 5b and 5c are removed by a hot phosphoric acid and an underlying oxide film 4 is etched back to thereby expose an active region, whereby the trench isolation shown in FIG. 1 are obtainable.

In Example 3, end faces of the resist patterns 10 serve as an etching mask at the time of pre-planarization are not disposed on the trench isolation 3 even when alignment margins x1 are produced similarly to those in Example 2. Accordingly, an insulating film constituting the trench isolation 3 are not excessively etched at the time of pre-planarization and it is possible to consequently obtain the trench isolation 3 having a satisfactory shape. Further, since uppermost layers of the mask patterns 7a, 7b and 7c are composed of the polycrystal silicon films 6a, 6b and 6c which serve as an etching stopper at the time of pre-planarization, the silicon nitride films 5a, 5b and 5c and layers positioned lower than the silicon nitride films are not excessively etched after the pre-planarization, and it is possible to protect a semiconductor substrate 1 as the active region and the silicon nitride films 5a, 5b and 5c composing the mask patterns 7a, 7b and 7c.

EXAMPLE 4

In Examples 1 through 3 described in the above, the cases that the insulating film formed by the HDP-CVD method is used at the time of embedding in the trench opening portions 2 are exemplified. In this Example 4, a case that the trench opening portion 2 is embedded by an insulating film formed by a low-pressure CVD method is described.

Figure 11:
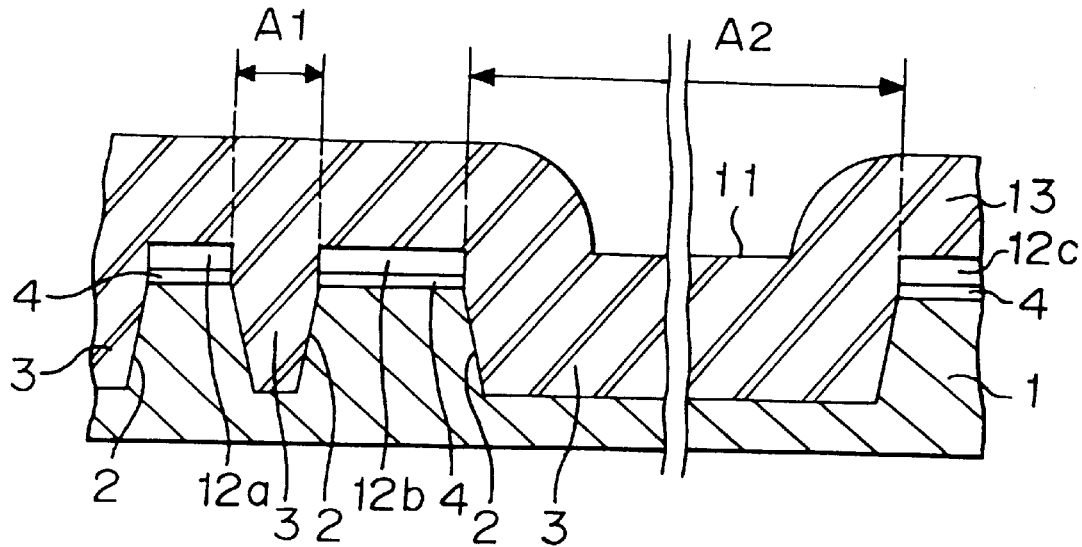
FIG. 11 is a cross-sectional view of a part of semiconductor device according to Example 4 of the present invention for explaining a process for thereof.
Figure 12:
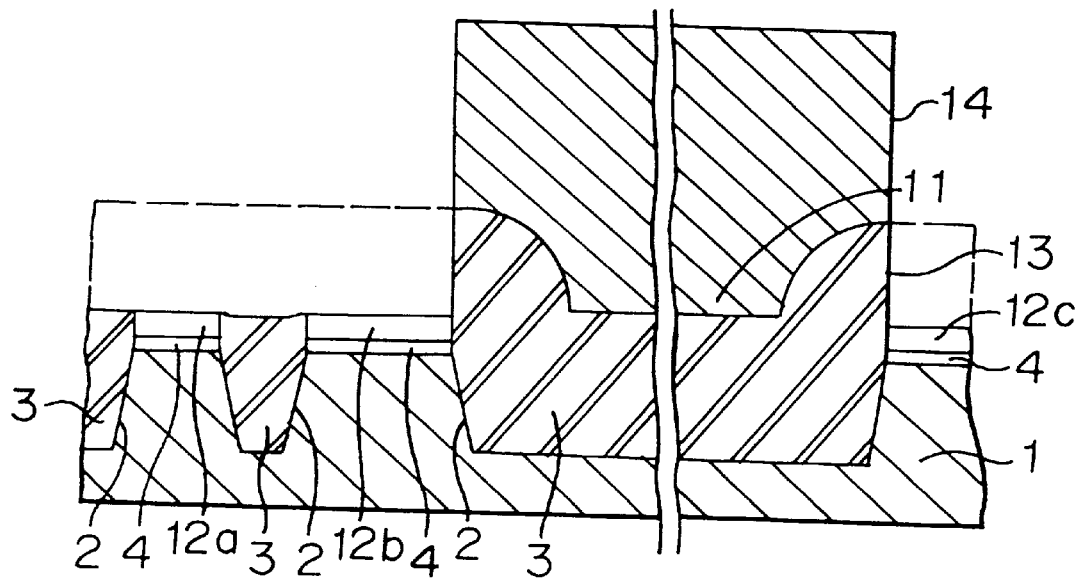
FIG. 12 is a cross-sectional view of a part of semiconductor device according to Example 4 of the present invention for explaining the process for thereof.

FIG. 11 shows a step of producing trench isolation 3 in accordance with Example 4, wherein a cross-sectional view at a stage of embedding in the insides of trench opening portions 2 by forming a low-pressure CVD oxide film 13 after a trench opening portions 2 of an opening width of 500 nm or more in a semiconductor substrate 1 is shown. Mask patterns 12a, 12b and 12c formed on an area of the semiconductor substrate 1, which is to be an active region, excluding the trench opening portions 2 are formed by successively laminating a silicon nitride film and a polycrystal silicon film in a similar manner of forming the mask patterns in Examples 1 through 3. The same reference numerals as those already described in the above designate the same or the similar portions.

In FIG. 11, reference A1 designates an opening width of one of the trench opening portions 2, wherein the size thereof is for example 500 nm and a minimum feature size in this semiconductor device is 500 nm. Also, reference A2 designates an opening width of the other trench opening portion 2, wherein the size thereof is larger than two times of an insulating film in a case that the insulating film having a film thickness of 500 nm is laminated at the time of embedding the trench opening portion 2. Namely, the reference A2 designates the opening width of trench opening portion 2 causing a recessed portion 11 on a surface of low-pressure CVD oxide film 13 when it is laminated As described in the above, after the trench opening portion 2 is embedded by the low-pressure CVD oxide film 13, a resist pattern 14 is patterned on the trench opening portion 2 having a opening width of A2; and the low-pressure CVD oxide film 13 is subjected to a dry etching using the resist pattern 14 as an etching mask to thereby remove a part of the low-pressure CVD oxide film 13 excessively laminated, whereby it is pre-planarized. At a time of pre-planarization by a dry etching, it is effective to constitute upper layers of the mask patterns 12a, 12b and 12c by a polycrystal silicon because a rate of pre-planarization usually scatters depending on densities and/or dimensions of the patterns and a location of the patterns in a wafer. Accordingly, even in a case that there is a portion etched excessively, a surface of the semiconductor substrate 1, which will be the active region, is not etched because the polycrystal silicon layer works as an stopper, whereby an necessary and sufficient pre-planarization can be performed.

Thereafter, it is processed similarly to the case of embedding by the HDP-CVD method as described in the above; the resist pattern 14 is removed; the low-pressure CVD oxide film 13 is polished by a CMP method using the mask patterns 12a, 12b and 12c as a stopper to thereby planarize a surface to be treated; the mask patterns 12a, 12b and 12c are removed; and the low-pressure CVD oxide film 13 on the active region is completely removed by etching back the whole surface of oxide film, whereby the trench isolation having an excellent surface planarity is obtainable.

As described in the above, even in the case that the trench opening portion 2 is embedded by the low-pressure CVD oxide film 13, it is possible to reduce an amount of abrasion using the CMP method by reducing the thickness of low-pressure CVD oxide film 13 which is excessively laminated by the pre-planarization. Also, it is possible to improve the planarity since the heights of protruded portions, which should be etched, of the low-pressure CVD oxide film 13, which is left after the pre-planarization, can be made substantially the same.

EXAMPLE 5

In Example 4, the case that the trench opening portion 2 is embedded by the insulating film formed by the low-pressure CVD method is exemplified, wherein the resist patterns 14 used as an etching mask at the time of pre-planarization is positioned above the trench opening portion 2 on which the surface of low-pressure CVD oxide film 13 has the recessed portion 11 and the end surface of resist pattern 14 is positioned above the end surface of trench opening portion 2.

In Example 5, a case that an etching mask used for pre-planarization is formed in a region including a trench opening portion 2, on which surface a low-pressure CVD oxide film 13 has a recessed portion 11, and protruding from the end surface of the trench opening portion 2 to the side of an active region (or mask patterns 12b and 12c) by an alignment margin x1 is described.

Figure 13:
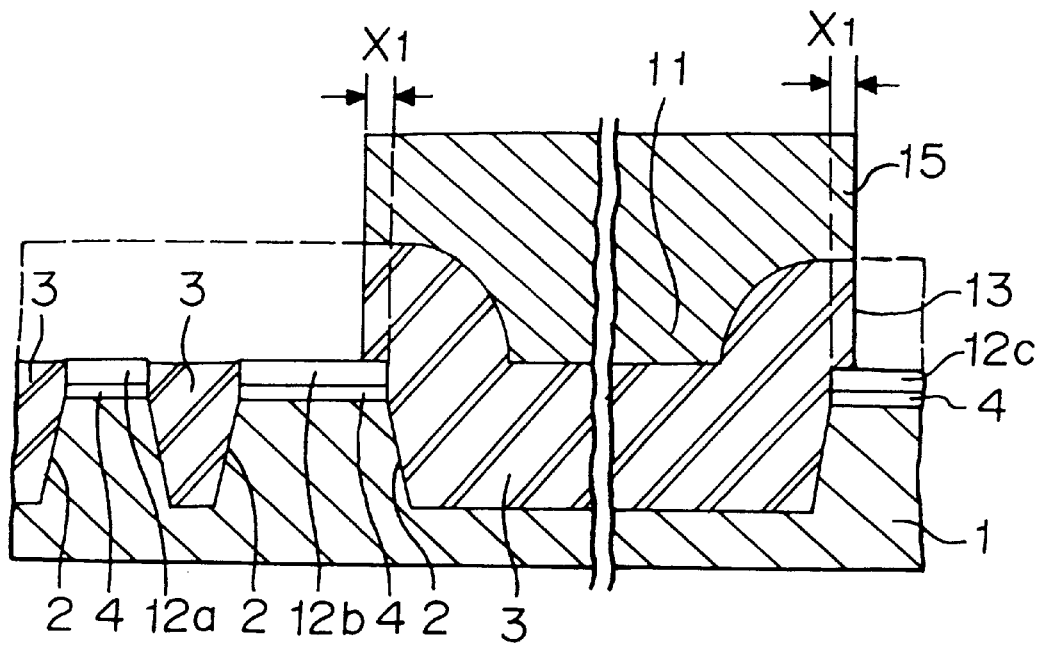
FIG. 13 is a cross-sectional view of a part of a semiconductor device according to Example 5 of the present invention for explaining a process for thereof.

FIG. 13 is a cross-sectional view for showing a step of pre-planarization in a method of manufacturing a semiconductor device according to Example 5.

In the Figure, numeral 15 designates a resist pattern formed as an etching mask on the low-pressure CVD oxide film 13, which resist pattern is patterned to have a shape of covering a region of forming the trench opening portion 2 having a larger opening width than a minimum feature size and a region protruding outwardly from the region of forming the trench opening portion 2 by the alignment margin x1.

Meanwhile, in a trench opening portion in which an opening width of trench isolation 3 is larger than the minimum feature size, a resist pattern is not formed in the region in which a value obtained by subtracting two times of the alignment margin x1 from a distance between the trench opening portion 2 and another trench opening portion 2 positioned closely thereto becomes the minimum feature size or less.

When the resist pattern 15 is used as an etching mask to conduct a dry etching with respect to the low-pressure CVD oxide film 13, most parts of the excessive low-pressure CVD oxide film 13 are removed to thereby attain the pre-planarization.

Thereafter, in a similar manner to Example 1, the resist pattern 15 is removed and an abrasion is conducted by a CMP method, whereby it is possible to improve the planarity of a surface to be processed after the pre-planarization.

By providing the resist pattern 15 having a shape reflecting the alignment margin x1, the trench isolation 3 having a satisfactory shape is obtainable without removing the insulating film which should exist as the trench isolation 3 even in a case that the dry etching is excessively performed at the time of pre-planarization. Further, it is not necessary to contract a design rule since the resist pattern 15 is not formed to have a size of the minimum feature size or less.

EXAMPLE 6

In Examples 4 and 5, the cases that the low-pressure CVD oxide film 13 is used for embedding the trench opening portion 2 and the resist pattern 14 or 15 having a forming area corresponding to that of the trench opening portion 2 or more is used as an etching mask for the pre-planarization is exemplified.

In this Example 6, a case that an etching mask is formed to have a forming area smaller than that of a trench opening portion 2 and a low-pressure CVD oxide film positioned in a predetermined region from the outer periphery of trench opening portion 2 to the inside thereof at the time of pre-planarization is described.

Figure 14:
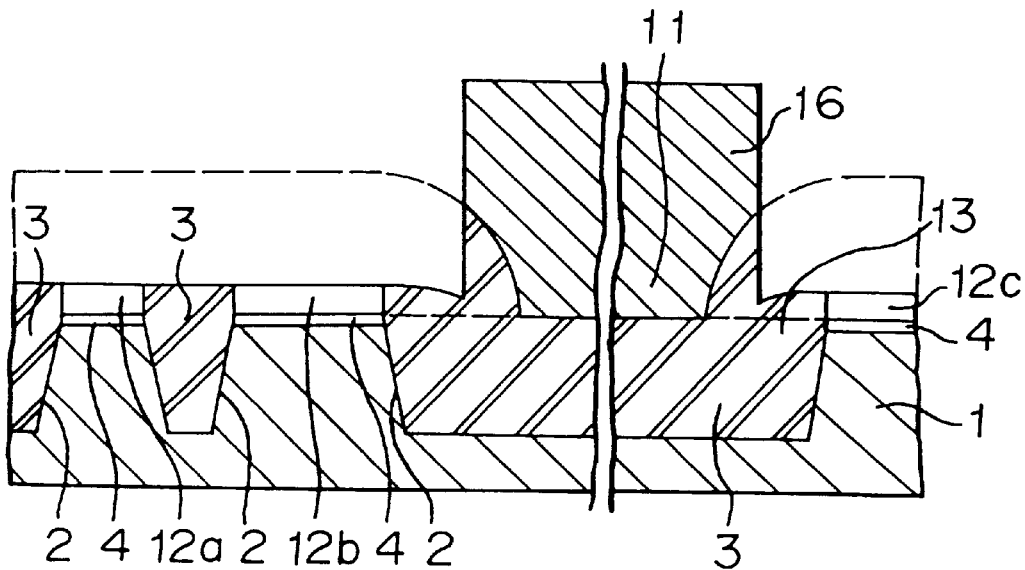
FIG. 14 is a cross-sectional view of a part of a semiconductor device according to Example 6 of the present invention for explaining a process flow thereof.

FIG. 14 shows a case that the pre-planarization is performed with respect to the low-pressure CVD oxide film 13 using a resist pattern 16 as an etching mask.

As shown in the Figure, a position where the resist pattern 16 is formed is determined so that a surface of the low-pressure CVD oxide film 13 has a height of the upper surface of an underlying oxide film 4 or more.

The end surface of resist pattern 16 is disposed on a region where the film thickness of low-pressure CVD oxide film 13 is a size corresponding to a sum of the depth of trench opening portion 2, the film thickness of underlying oxide film 4 and the film thickness of a part of low-pressure CVD oxide film 13 which is to be removed by the pre-planarization or more. The resist pattern 16 is disposed on a region of covering a recessed portion 11 in a surface of low-pressure CVD oxide film 13. The resist pattern 16 is not formed on a trench opening portion 2 having a relatively small opening width, above which a surface of the low-pressure CVD oxide film 13 does not have a recessed portion 11.

When the pre-planarization is performed using the above-described resist pattern 16, it is possible to leave a portion of the low-pressure CVD oxide film which will be consequently necessary as the trench isolation 3 and remove efficiently portions other than this. Further, by an abrasion to be conducted later by a CMP method, it is possible to obtain a processed surface having more excellent planarity, whereby the trench isolation 3 having a satisfactory shape is obtainable.

Specifically, Example 6 is applied to a case that many trench opening portions 2 having a relatively large opening width are formed, whereby the amount of abrasion processed by a CMP method can be reduced; the planarity is improved; and the processing time can be shortened.

EXAMPLE 7

In Examples 1 through 6, there were described about the steps adopted until the formation of the trench isolation 3. In this Example 7, a case that a DRAM memory cell is formed by a trench isolation 3 which is formed in accordance with the method of manufacturing of any one of Examples 1 through 6 is described.

Figure 15:
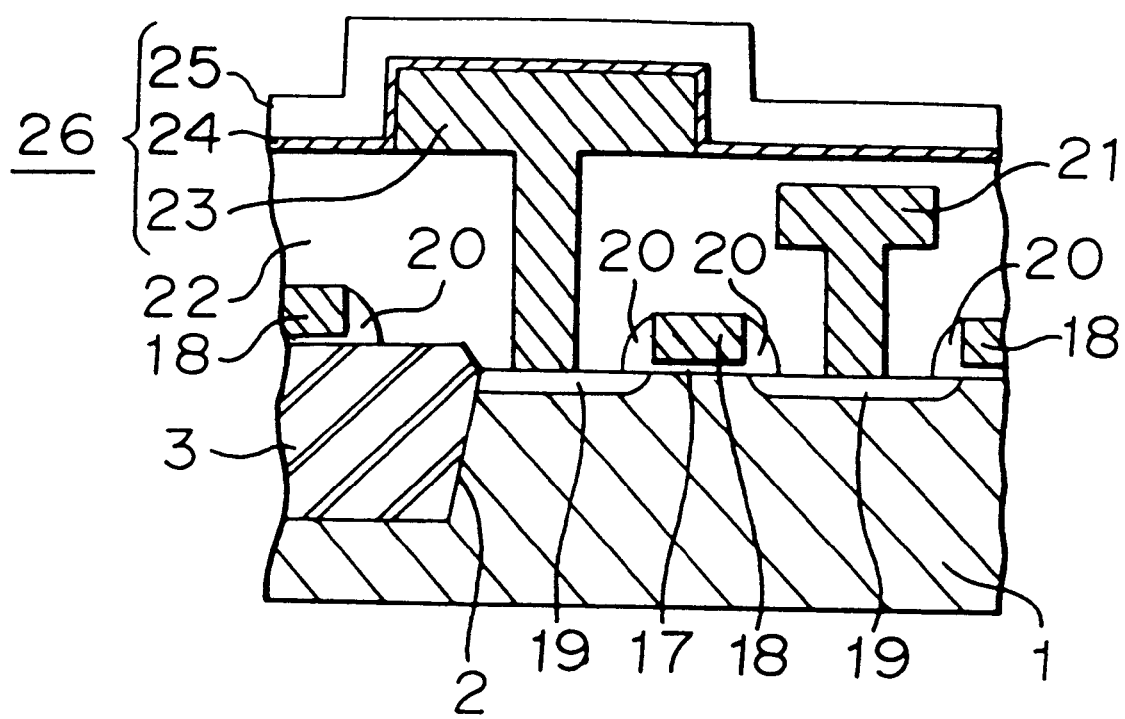
FIG. 15 is a cross-sectional view for showing a part of semiconductor device according to Example 7 of the present invention.
Figure 16:
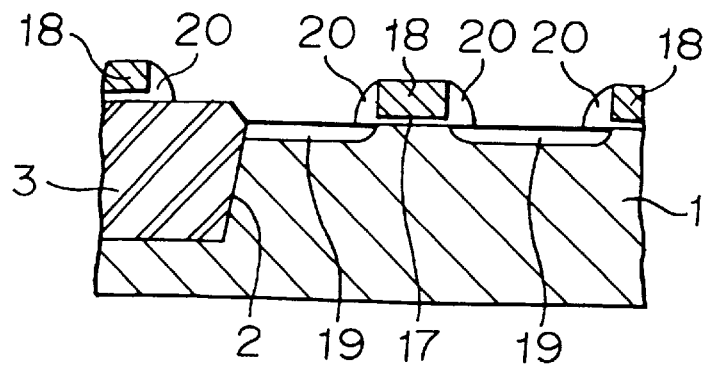
FIG. 16a is a cross-sectional view of a part of a semiconductor device according to Example 7 of the present invention for explaining a process flow thereof.
FIG. 16b is a cross-sectional view of a part of the semiconductor device according to Example 7 of the present invention for explaining the process flow thereof.
FIG. 16c is a cross-sectional view of a part of the semiconductor device according to Example 7 of the present invention for explaining the process flow thereof.
Figure 16:
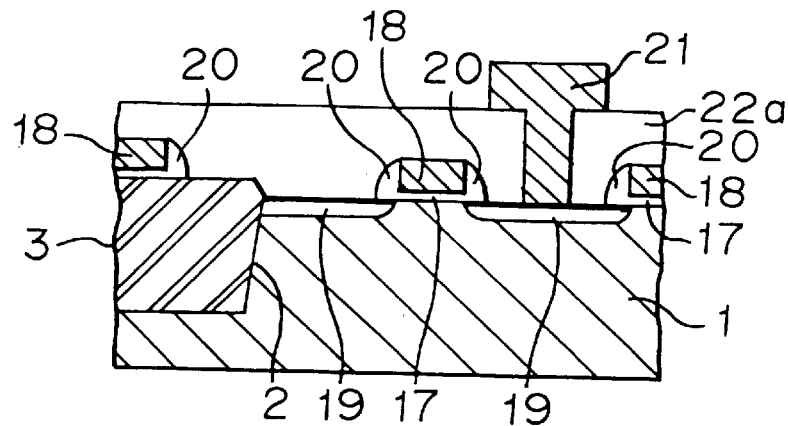
Figure 16:
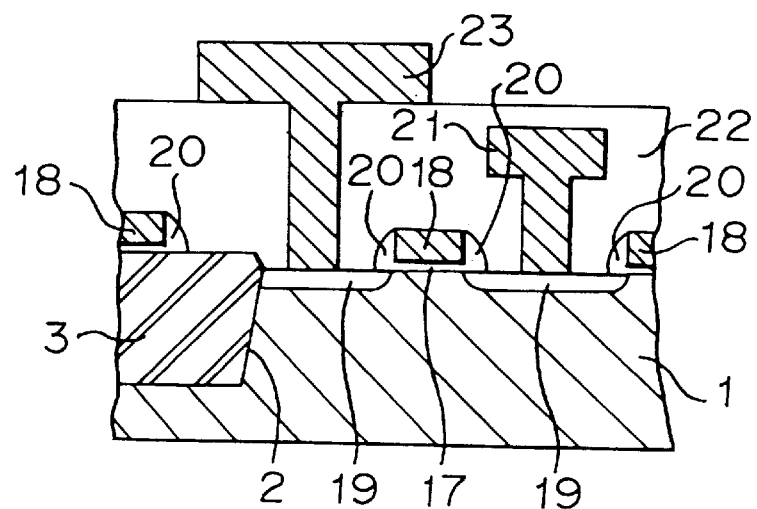
Figure 17:
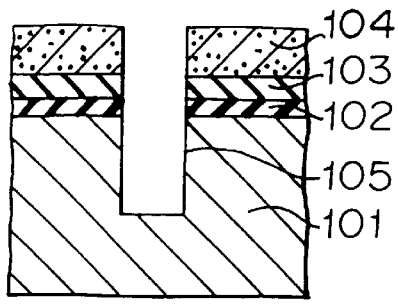
FIG. 17a is a cross-sectional view for showing a part of semiconductor device according to a conventional technique.
FIG. 17b is a cross-sectional view for showing a part of semiconductor device according to a conventional technique.
FIG. 17c is a cross-sectional view for showing a part of semiconductor device according to a conventional technique.
FIG. 17d is a cross-sectional view for showing a part of semiconductor device according to a conventional technique.
FIG. 17e is a cross-sectional view for showing a part of semiconductor device according to a conventional technique.
Figure 17:
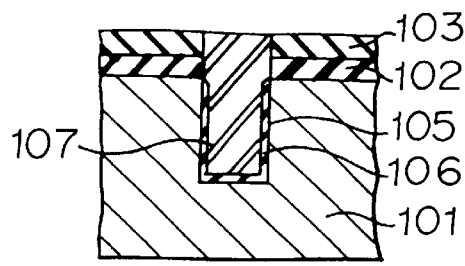
Figure 17:
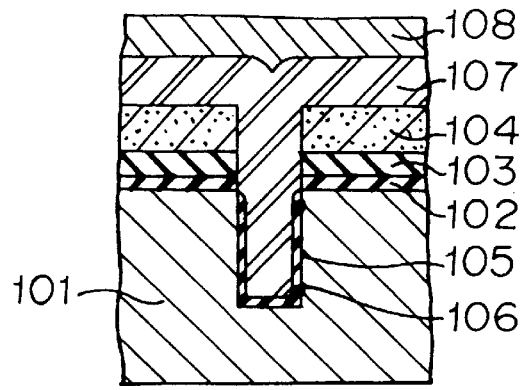
Figure 17:
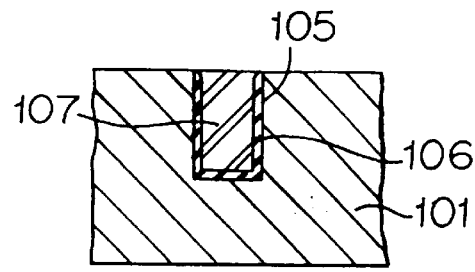
Figure 17:
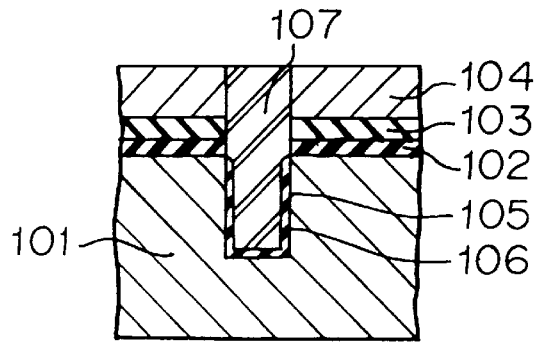
Figure 18:
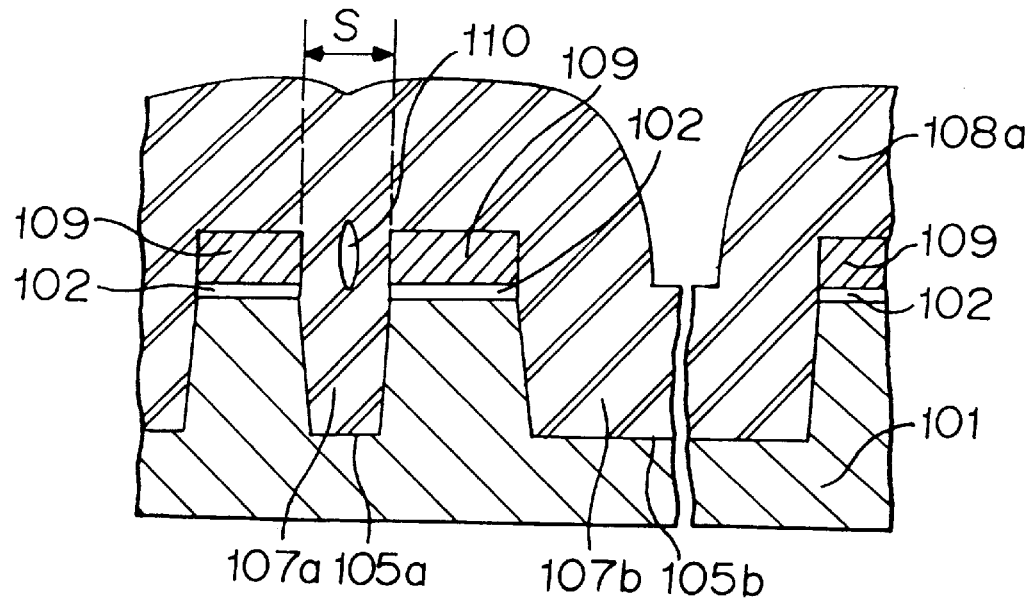
FIG. 18 is a cross-sectional view for showing a part of semiconductor device according to a conventional technique.
Figure 19:
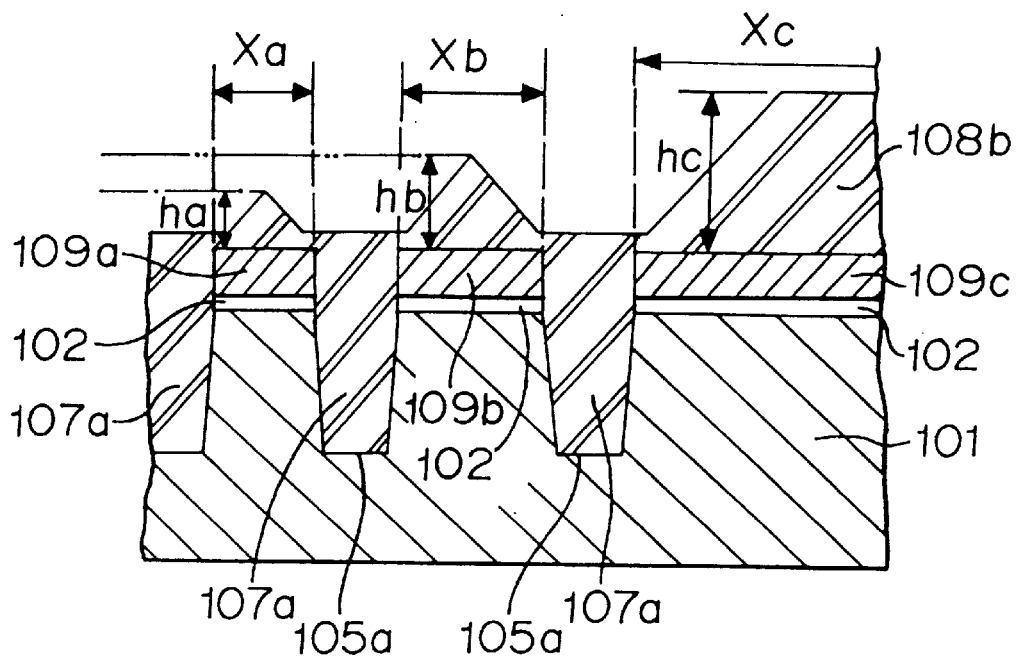
FIG. 19 is a cross-sectional view for showing a part of semiconductor device according to a conventional technique.
Figure 20:
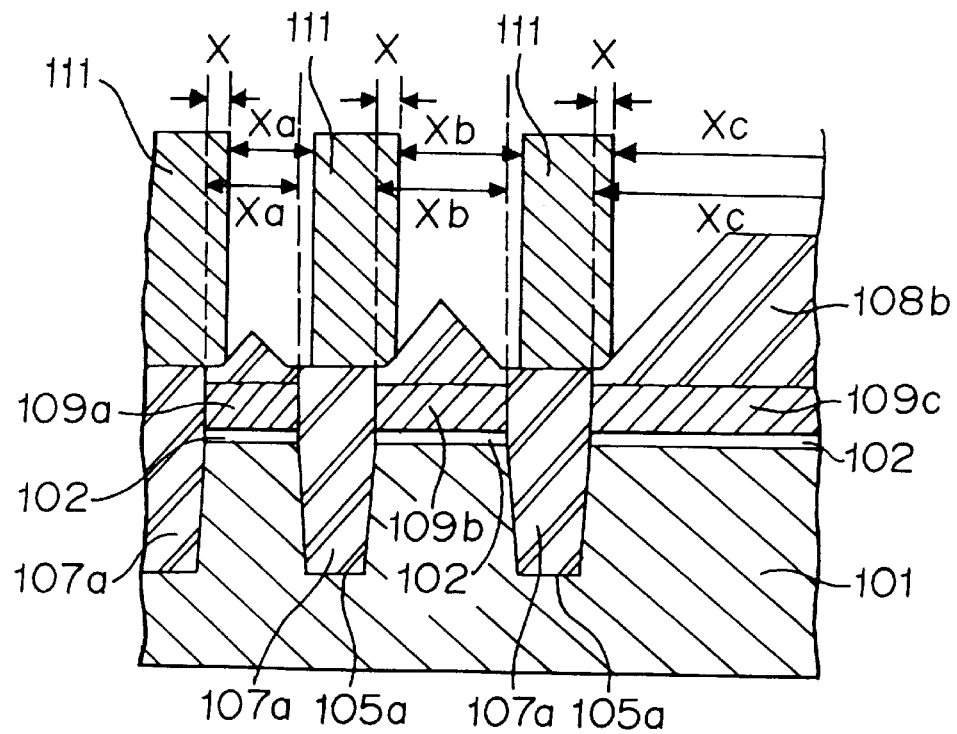
FIGS. 20(a) and 20(b) are cross-sectional views for showing a part of semiconductor device according to a conventional technique.
Figure 20:
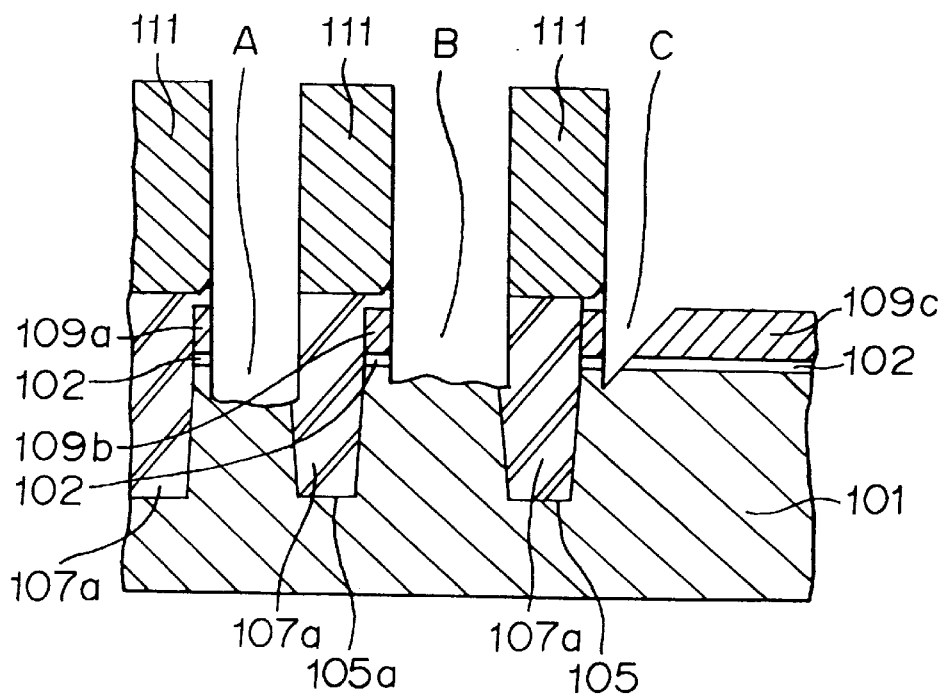

FIG. 15 is a cross-sectional view of the DRAM memory cell, wherein numeral 17 designates a gate oxide film formed on a surface of active region in a semiconductor substrate 1; numeral 18 designates a word wire patterned on the gate oxide film 17 (a portion on the gate oxide film 17 is an gate electrode 18); numeral 19 designates a pair of source/drain regions formed on a surface area of the semiconductor substrate 1 and arranged interposing a channel region under the gate electrode 18; and numeral 20 designates sidewalls made of an insulating film deposited on the sides of gate electrodes 18.

Numeral 21 designates a bit wire formed on one of the source/drain regions 19; numeral 22 designates an inter-layer insulating film laminated on the surface area of semiconductor substrate 1 including the bit wire 21 and the gate electrodes 18; numeral 23 designates a storage node provided on the inter-layer insulating film so as to be in contact with the other one of source/drain region 19; numeral 25 designates a cell plate laminated above the storage node 23 interposing a dielectric film 24; and numeral 26 designates a capacitor which is composed of the storage node 23, the dielectric film 24 and the cell plate 25.

A method of forming the DRAM memory cell shown in FIG. 15 is as follows.

At first, the trench isolation 3 is formed by the method in accordance with any one of Examples 1 through 6. When the opening width of trench opening portion 2 in which the trench isolation 3 is embedded is so small that the seam is produced by embedding using low-pressure CVD method, it is necessary to use the method described in any one of Examples 1 through 3. However, in the other occasions, the method described in any one of Examples 1 through 6 can be used without problem.

Thereafter, as shown in FIG. 16a, a P-well region is formed on the surface of semiconductor substrate 1; the surface of semiconductor substrate 1 is subjected to a thermal oxidation; and the gate oxide film 17 is formed to have a film thickness of about 10 nm. Further, for example, a polycrystal silicon film is formed to have a film thickness of about 100 nm by a CVD method and thus formed polycrystal silicon film is patterned in order to obtain the word wire (gate electrode) 18. In the next, As is implanted using the trench isolation 3 and the gate electrode 18 as a mask under a condition of 500 KeV and $5 \times 10^{13}/cm^2$ to thereby form the source/drain region of n-type. Further, after an oxide film having a film thickness of about 100 nm is laminated on the whole surface thereof by a CVD method, the sidewalls 20 are formed by an etch back.

In the next, as shown in FIG. 16b, the silicon oxide film is laminated to have a film thickness of about 700 nm by a CVD method in order to obtain an inter-layer insulating film 22a. Then, a contact hole is opened by piercing the inter-layer insulating film 22a so that a surface of one of source/drain regions 19 is partly exposed. In the next, a polycrystal silicon including impurities is formed; to have a film thickness of about 100 nm by a CVD method; a tungsten silicide is formed to have a film thickness of about 100 nm in order to embed a contact hole; and a conductive film made of a polycrystal silicon and a tungsten silicide is laminated on a surface of the inter-layer insulating film 22a. Thereafter, the conductive film is subjected to patterning to obtain a bit wire 23.

Thereafter, as shown in FIG. 16c, a silicon oxide film is laminated to have a film thickness of about 700 nm by a CVD method to obtain an inter-layer insulating film 22; and a contact hole for exposing a part of the other one of the source/drain regions 19 is opened by piercing the inter-layer insulating film 22. Further, a polycrystal silicon including impurities is formed to have a film thickness of about 800 nm to embed in the contact hole; and simultaneously a storage node made of a conductive film is laminated on a surface of the inter-layer insulating film 22. Then, the conductive film is subjected to a patterning to obtain the storage node 23.

Thereafter, a capacitor 26 is obtainable by laminating a silicon oxinitride (SiON) film so as to have a film thickness of about 7 nm as a dielectric film and forming a polycrystal silicon including impurities, which is to be a cell plate 25, so as to have a film thickness of about 50 nm by a CVD method. Thus, a DRAM memory cell structure shown in FIG. 15 can be formed. Although some other processes such as a connection to a peripheral circuit are necessary, description of such processes are omitted in here.

In a device which has been very highly integrated such as the DRAM device described in Example 7, the trench isolation for separating elements between which a separative width is narrow is used. It is possible to obtain a trench isolation having a satisfactory shape by producing the same in accordance with the present invention. Further, since the trench isolation can have a uniform shape in the DRAM device, in which many memory cells are arranged, it is possible to restrict scattering of characteristics of elements between respective memory cells, whereby a stable operation of the device and a high yield can be attained consequently.

The first advantage of the method of manufacturing a semiconductor device according to the present invention is that the amount of abrasion by the CMP method can be reduced the shape of trench isolation to be obtained consequently can be made satisfactory by improving the planarity of surface to be treated since, after the trench opening portion is embedded by the insulating film, a part of the insulating film laminated excessively on the semiconductor substrate is removed by the dry etching for the pre-planarization; and thereafter it is polished by the CMP method.

The second advantage of the method of manufacturing a semiconductor device according to the present invention is that the second mask layer can be polished at substantially the same polishing rate as that in the insulating layer at the time of the pre-planarization by the CMP method and the first mask layer can be used as a stopper at the time of polishing since the first mask pattern has a multi-layer structure in which the first mask layer and the second mask layer are successively laminated and the second mask layer can be used as an etching stopper at the time of pre-planarization in order to restrict the piercing in the mask pattern caused by the dry etching. It is also possible to improve the planarity of the surface to be treated after the CMP since the amount of abrasion by the CMP method is reduced by the pre-planarization, whereby the surface planarity of the trench isolation to be obtained consequently can also be improved.

The third advantage of the method of manufacturing a semiconductor device according to the present invention is that a sufficient etching selectivity can be assured when the pre-planarization is conducted with respect to the insulating film used for embedding the trench opening portion, for example a silicon oxide film to restrict an excessive etching with respect to the first mask layer and the active region since the second mask layer is made of non-single crystal silicon film.

The fourth advantage of the method of manufacturing a semiconductor device according to the present invention is that an excessive etching with respect to the region of forming trench isolation can be restricted when the alignment is deviated since the second mask pattern is formed in consideration of an alignment margin.

The fifth advantage of the method of manufacturing a semiconductor device according to the present invention is that the heights of the protruded portions in the insulating film left after the pre-planarization can be made substantially the same since the second mask pattern is formed in a region protruding from the outer periphery of the region of forming trench isolation by a half of the minimum feature size when the insulating film is laminated by the HDP-CVD method for embedding the trench opening portion. Accordingly, the planarity of the surface to be treated and the trench isolation which are obtained by the planarization using the CMP method in a later step can be improved.

The sixth advantage of the method of manufacturing a semiconductor device according to the present invention is that, in a case of embedding in the trench opening portion by the insulating film formed by the low-pressure CVD method, a part of the insulating film which was excessively laminated can be removed effectively by the etching at the time of pre-planarization, whereby the amount of polishing the insulating film can be reduced at the time of planarization by the CMP method in a later step, and the planarity of the surface to be treated can further be improved.

The seventh advantage of the method of manufacturing a semiconductor device according to the present invention is that contraction of the design rule becomes unnecessary since the second mask pattern used as an etching mask at the time of pre-planarization is formed to have a minimum feature size or more.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a semiconductor device comprising:

forming a first mask pattern having a clipping pattern corresponding to a trench isolation region on a semiconductor substrate, forming a trench opening by etching said trench isolation region, depositing an insulating material on said semiconductor substrate so as to completely fill said insulating material into said trench opening, forming a second mask pattern over said trench isolation region, pre-planarizing by dry etching said insulating film using said second mask pattern as an etching mask, removing said second mask pattern and polishing the insulating film using CMP and using said first mask pattern as a stopper layer, and wherein the end surface of the second mask pattern used for processing the pre- planariation of the insulating film is deposited on an end portion of a first region corresponding to the trench isolation region or a second region surrounding said first region; and wherein:

the distance from the end portion of the first region to the outer periphery of the second region corresponds to a half of a minimum feature size when the insulating film is laminated using a HDP-CVD technique.

2. A method of manufacturing a semiconductor device according to claim 1, wherein the second mask pattern is patterned to have a size of minimum feature size or more.

* * * * *